(12) United States Patent
McCollum

(10) Patent No.: US 7,119,393 B1
(45) Date of Patent: Oct. 10, 2006

(54) TRANSISTOR HAVING FULLY-DEPLETED JUNCTIONS TO REDUCE CAPACITANCE AND INCREASE RADIATION IMMUNITY IN AN INTEGRATED CIRCUIT

(75) Inventor: John McCollum, Saratoga, CA (US)

(73) Assignee: Actel Corporation, Mountain View, CA (US)

( * ) Notice: Subject to any disclaimer, the term of this patent is extended or adjusted under 35 U.S.C. 154(b) by 1 day.

(21) Appl. No.: 10/629,337

(22) Filed: Jul. 28, 2003

(51) Int. Cl.
*H01L 29/788* (2006.01)
*H01L 29/76* (2006.01)
*H01L 29/792* (2006.01)

(52) U.S. Cl. ............... 257/316; 257/314; 257/315; 257/317; 257/318; 257/319; 257/320; 257/321; 257/322; 257/323; 257/324; 257/325; 257/326; 257/386; 257/392; 257/548; 257/504; 257/545

(58) Field of Classification Search ........ 257/314–326, 257/386, 392, 548, 504, 545
See application file for complete search history.

(56) References Cited

U.S. PATENT DOCUMENTS

| | | | | |
|---|---|---|---|---|
| 5,359,219 A | * | 10/1994 | Hwang | 257/351 |
| 5,457,652 A | * | 10/1995 | Brahmbhatt | 365/185.27 |
| 5,471,082 A | * | 11/1995 | Maeda | 257/362 |
| 5,487,033 A | * | 1/1996 | Keeney et al. | 365/185.19 |
| 5,559,044 A | * | 9/1996 | Williams et al. | 438/234 |
| 5,635,754 A | | 6/1997 | Strobel et al. | 257/659 |
| 5,726,477 A | * | 3/1998 | Williams et al. | 257/402 |
| 5,751,631 A | * | 5/1998 | Liu et al. | 365/185.01 |
| 5,822,243 A | * | 10/1998 | Shone | 365/185.08 |
| 5,837,554 A | * | 11/1998 | Contiero et al. | 438/257 |
| 5,838,048 A | * | 11/1998 | Hirai et al. | 257/378 |
| 5,854,099 A | * | 12/1998 | Farrenkopf | 438/201 |
| 5,874,767 A | * | 2/1999 | Terashima et al. | 257/487 |
| 5,960,272 A | * | 9/1999 | Ishimaru | 438/207 |
| 5,978,276 A | * | 11/1999 | Wong | 365/185.29 |
| 6,009,017 A | * | 12/1999 | Guo et al. | 365/185.28 |
| 6,023,293 A | * | 2/2000 | Watanabe et al. | 348/294 |
| 6,060,742 A | * | 5/2000 | Chi et al. | 257/316 |
| 6,100,557 A | * | 8/2000 | Hung et al. | 257/299 |
| 6,133,604 A | * | 10/2000 | Chi | 257/315 |
| 6,134,150 A | * | 10/2000 | Hsu et al. | 365/185.29 |
| 6,169,693 B1 | * | 1/2001 | Chan et al. | 365/185.3 |
| 6,187,635 B1 | * | 2/2001 | Kaya | 438/264 |
| 6,324,102 B1 | | 11/2001 | McCollum | 365/185.33 |
| 6,329,246 B1 | * | 12/2001 | Lee | 438/264 |
| 6,417,542 B1 | * | 7/2002 | Werner | 257/335 |
| 6,492,206 B1 | | 12/2002 | Hawley et al. | 438/131 |

(Continued)

FOREIGN PATENT DOCUMENTS

JP 61123171 A * 6/1986

*Primary Examiner*—Ida M. Soward
(74) *Attorney, Agent, or Firm*—Sierra Patent Group, Ltd

(57) ABSTRACT

A floating-gate transistor for an integrated circuit is formed on a p-type substrate. An n-type region is disposed over the p-type substrate. A p-type region is disposed over the n-type region. Spaced apart n-type source and drain regions are disposed in the p-type region forming a channel therein. A floating gate is disposed above and insulated from the channel. A control gate is disposed above and insulated from the floating gate. An isolation trench disposed in the p-type region and surrounding the source and drain regions, the isolation trench extending down into the n-type region. The substrate, the n-type region and the p-type region each biased such that the p-type region is fully depleted.

8 Claims, 3 Drawing Sheets

U.S. PATENT DOCUMENTS

| | | | |
|---|---|---|---|
| 6,501,685 B1* | 12/2002 | Hsu et al. | 365/185.33 |
| 6,617,632 B1* | 9/2003 | Taniguchi et al. | 257/296 |
| 6,624,026 B1* | 9/2003 | Liu et al. | 438/264 |
| 6,887,758 B1* | 5/2005 | Chindalore et al. | 438/257 |
| 6,908,818 B1* | 6/2005 | Hsu et al. | 438/266 |
| 6,952,031 B1* | 10/2005 | Yamauchi | 257/314 |
| 2002/0031882 A1* | 3/2002 | Uchida | 438/228 |
| 2002/0113286 A1* | 8/2002 | Shimizu | 257/502 |
| 2002/0153546 A1* | 10/2002 | Verhaar | 257/296 |
| 2004/0000681 A1* | 1/2004 | Shinohara et al. | 257/290 |
| 2004/0026749 A1* | 2/2004 | Ohsawa | 257/390 |
| 2004/0065922 A1* | 4/2004 | Wang | 257/355 |
| 2005/0180215 A1* | 8/2005 | Shum et al. | 365/185.22 |

* cited by examiner

US 7,119,393 B1

TRANSISTOR HAVING FULLY-DEPLETED JUNCTIONS TO REDUCE CAPACITANCE AND INCREASE RADIATION IMMUNITY IN AN INTEGRATED CIRCUIT

BACKGROUND

1. Field of the Invention

The present invention relates to programmable switches in an integrated circuit. More specifically, the invention relates to reducing capacitance of a transistor junction to increase performance and speed in an integrated circuit and to increasing radiation immunity in integrated circuits.

2. Background

Integrated circuits in general can benefit from lower junction capacitances of MOS transistors to improve switching speed. Integrated circuits can also benefit from by using transistors that have improved immunity to radiation. These benefits are desirable in both standard MOS transistors and floating-gate memory transistors.

FPGA integrated circuits are known in the art. FPGAs may be classified in one of two categories. One category of FPGAs employs programmable elements that are one-time programmable, such as antifuses for making programmable connections. The other category of FPGAs employs programmable elements that are re-programmable and uses transistor switches to make programmable connections.

Typically, an FPGA has an array of logic elements and wiring interconnections with many thousands of programmable interconnect cells so that the FPGA can be configured by the user into an integrated circuit with defined functions. Each programmable interconnect cell, or switch, can connect two circuit nodes in the integrated circuit to make or break a wiring interconnection or to set the function or functions of a logic element.

Reprogrammable FPGA devices include some means for storing program information used to control the programmable elements. Non-volatile memory devices such as EPROMs, EEPROMs, non-volatile RAM and flash memory devices have all been proposed for or used to store programming information in the class of FPGA applications.

An ideal memory device optimizes density, preserves critical memory in a nonvolatile condition, is easy to program and reprogram, and is read quickly. Some non-volatile memory devices meet more of the above requirements than others. For instance, EPROMS are high density, however, they have to be exposed to ultra-violet light for erasure. EEPROMS are electrically byte-erasable, but are less reliable and have the lowest density. Flash memory devices, however, are low-cost, high-density, low-power, high-reliability devices resulting in a high-speed architecture.

Integrated circuits, notably memories, such as memory cells, are often used in environments where they are or may be subjected to high-energy particles. They may also be subjected to a high-energy electromagnetic pulse field. Such particles may include alpha, beta, gamma and other particles, which have sufficient energy to pass through the outer surface of a package and impact the memory cell itself.

Outer space is one environment in which a memory cell would be subjected to impact from a high-energy particle. When the sun experiences an energy eruption, which occurs with increasing frequency and intensity during high activity sunspot cycles, the likelihood of impact of a high-energy particle on objects orbiting the earth becomes extremely high. Other environments, such as nuclear strike may also produce high-energy particles or a high-energy electromagnetic pulse (EMP).

Many integrated circuits in use today have a reversed-biased PN junction that is subject to short-circuiting due to charges generated by the high-energy particle hit. If this happens to a standard memory cell, the logic state of the cell becomes unknown. It may be inverted, or the data may be erased. As is known to those of ordinary skill in the art, if the programming charge stored in the memory cell is flipped by exposure to radiation, the state of the switching transistor cannot be guaranteed.

Accordingly, current memory cells must either be protected from the high-energy particle hit or designed in such a way that they are resistant to a change in data state even if hit by a high energy particle or exposed to a high energy EMP.

Hence, there is a need in the art for a transistor, memory cell, or circuit node that is resistant to a change in data state even if hit by a high energy particle or exposed to a high energy EMP. There is also a need in the art for a transistor, memory cell, or circuit node that has a reduced junction capacitance.

SUMMARY OF THE INVENTION

The present invention comprises a transistor device for an integrated circuit having a source, a drain and a gate. The transistor device also comprises a p-substrate level, an n-well layered on the p-substrate and a fully depleted p-well layered on the n-well. The transistor device has a first N+ region layered on the fully depleted p-well and a second N+ region layered on the fully depleted p-well. The first N+ region is coupled to the drain of the transistor and the second N+ region layered on the P-well is coupled to the source.

A better understanding of the features and advantages of the present invention will be obtained by reference to the following detailed description of the invention and accompanying drawings, which set forth an illustrative embodiment in which the principles of the invention are utilized.

DETAILED DESCRIPTION

Those of ordinary skill in the art will realize that the following description of the present invention is illustrative only and not in any way limiting. Other embodiments of the invention will readily suggest themselves to such skilled persons.

Figure 1:
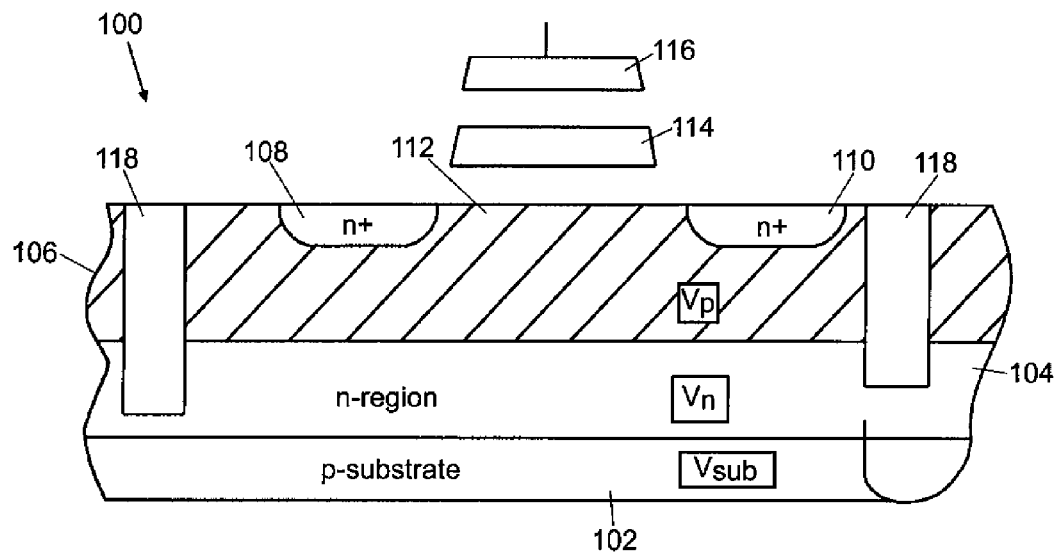
FIG. 1 is a cross-sectional view of an illustrative n-channel embodiment of a reduced-capacitance floating-gate transistor according to the present invention.

FIG. 1 is a cross-sectional view of an n-channel floating-gate transistor 100 according to an illustrative embodiment of the present invention. Transistor 100 is formed on a p-type substrate 102. P-type substrate 102 may be doped to a level of about 1e18. An n-type region 104 is disposed above the substrate 102 and may be formed, for example, as an n-well doped to a level of about 1e18 or as a buried layer.

A p-type region 106 is disposed above n-type region 104 and may also be formed as a well structure doped to a level of about 1e17. Those of ordinary skill in the art will appreciate that the doping levels will be process-generation dependent and will also be limited by the voltages to be used in the devices to avoid zener breakdown voltages close to the operating range.

N-type source and drain regions 108 and 110 are heavily doped and are disposed in the p-type region 106 and are spaced apart from one another to form a channel region 112. Floating gate 114, preferably formed from doped polysilicon as is known in the art, is disposed above and insulated from the channel 112 and is self aligned with source and drain regions 108 and 110 as is known in the art. Control gate 116, also preferably formed from polysilicon, is disposed above and insulated from floating gate 114. While the embodiment depicted in FIG. 1 is a floating gate memory cell transistor, persons of ordinary skill in the art will readily observe that the principles of the present invention are equally applicable to standard, single-gate MOS transistors.

An isolation trench 118 surrounds transistor 100 to isolate it from adjacent devices. FIG. 1 only shows the side portions of isolation trench 118; persons of ordinary skill in the art will recognize that portions of isolation trench 118 located in front of and behind the plane of the figure are not shown. A p-type implant may be made in trench 118 as shown in FIG. 1.

In transistor 100, p-type region 106 is fully depleted by reverse biasing the n-type region with respect to both it and the p-type substrate 102. As an illustrative example, in a device created with a 0.15 micron process, the sources and drains will have voltages of between about zero and 1.5 volts, n-type region 104 may be biased (Vn) at about 3.3 volts, p-type region 106 may be charge-pump biased (Vp) at about −2 to about −3 volts, and substrate 102 may be biased (Vsub) at about −3 volts. The punch through of n-type layer 104 to the source region 108 and drain region 110 is greater than 3.3 volts but is fully depleted by the approximately −3 volts on the substrate 102. This serves to reduce the junction capacitance of the transistor 100 because the junction between N+ drain region 110 and the fully depleted p-type region 106 has very little junction capacitance as compared with a standard transistor of the same generation without the fully depleted well. Persons of ordinary skill in the art will recognize that the bias voltages can readily be optimized for device-size scaling and different doping levels.

In addition, because of the punch through of the n-type region 104 to the N+ source region 108 and drain region 110 and because p-type region 106 is fully depleted by the −3 volts on the buried p-type substrate layer 102, a field will sweep away any minority carriers to the n-type region 104, thus protecting the surface from being upset by a radiation pulse. Also, the transistor gamma is greatly reduced as change in charge of p-well 106 to the surface is small.

Moreover, by using trench isolation the device field can be run into the substrate buried layer N+ thereby preventing lateral punch through. Thus, the only leakage that may be a concern for radiation hits is $V_T$ drift and leakage at the channel-edge to field oxide boundary.

Figure 4:
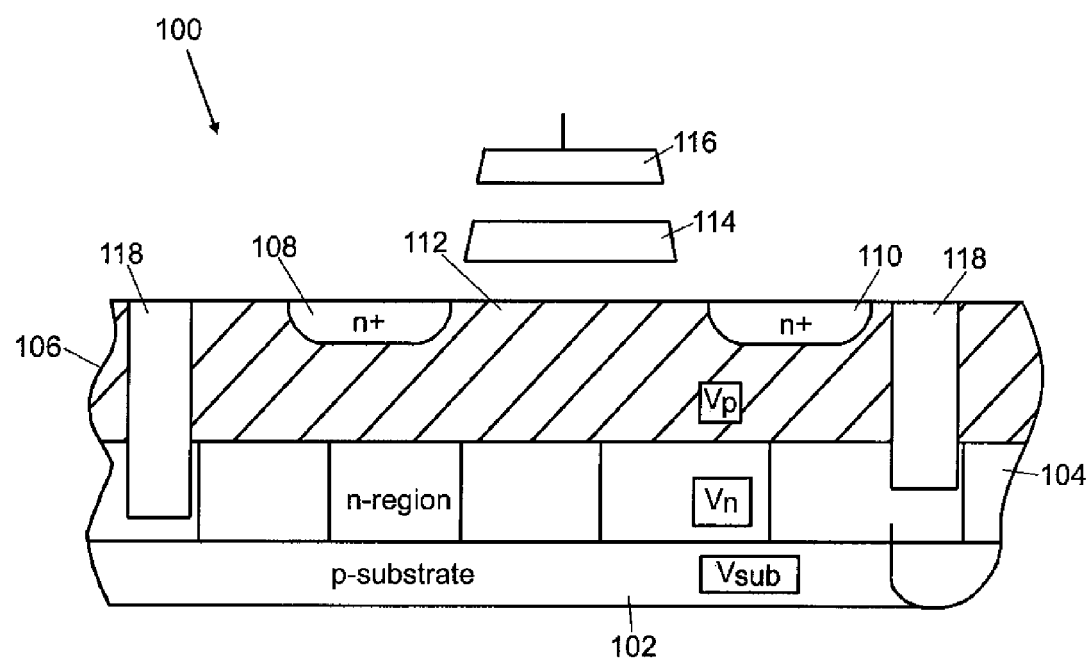
FIG. 4 is a cross-sectional view of the n-channel embodiment of FIG. 1 having an n-type region laid out in a grid formation.

According to one aspect of the invention, the n-type region 104 may be laid out in a grid formation, as shown in FIG. 4, to improve the impedance of minority carriers in depleted regions in order to avoid filling the wells with charge and thus changing the $V_T$ of the device. FIG. 4 is merely one example of the n-channel embodiment of FIG. 1 having an n-type region laid out in a grid formation with like elements numbered alike. The present invention is not intended to be limited to this one example. It is contemplated that other grid formations known in the art may be used as well.

Figure 2:
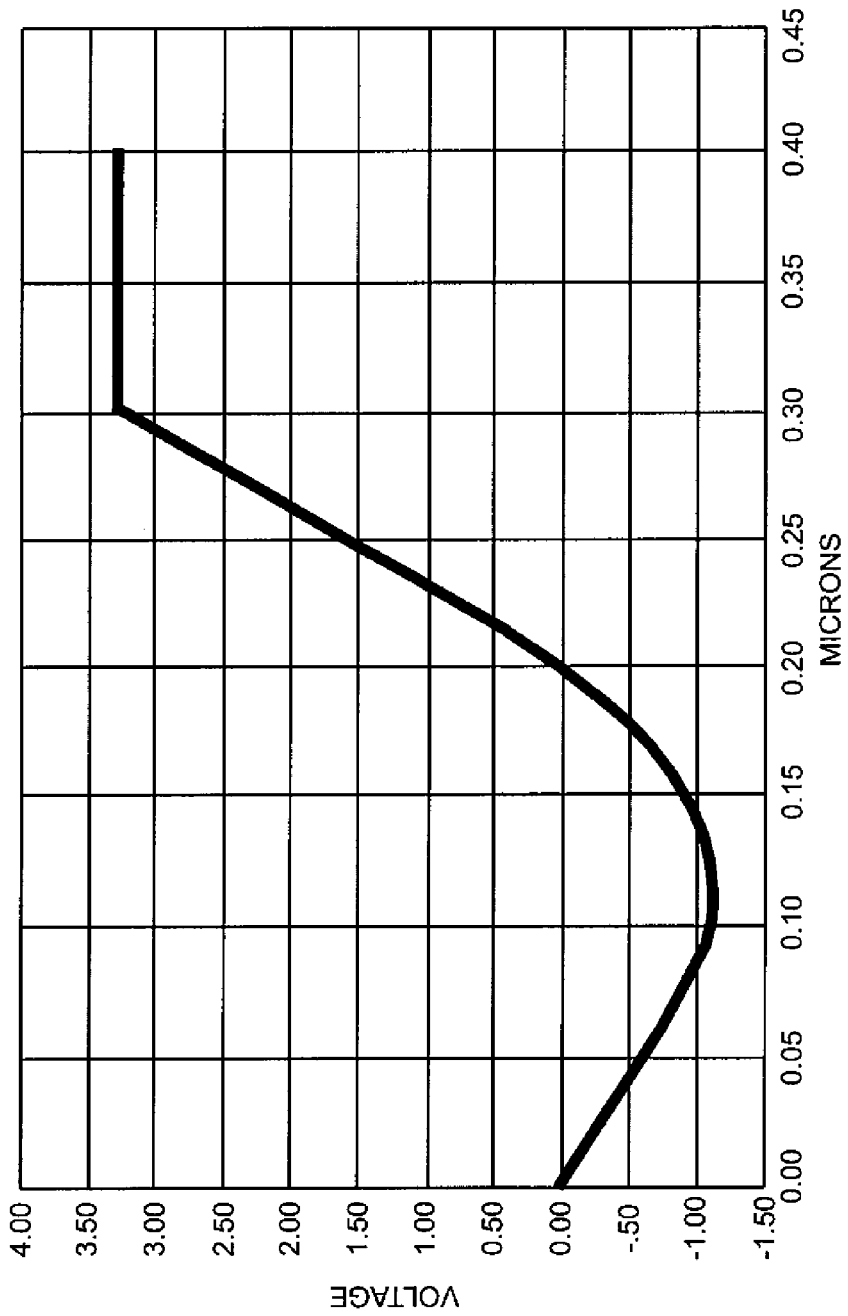
FIG. 2 shows the voltage potential in the bulk under the surface of the transistor device according to FIG. 1 when it is biased at VT.

FIG. 2 shows the Fermi Level of a fully space-charge-depleted N-Channel transistor going vertically down into the substrate directly under the gate electrode. As can be seen at 0 microns the surface channel is biased at 0 volts as this device is in the on state (it could also be at Vcc). Continuing down into the substrate the fully depleted P-type silicon adds negative charge and therefore the voltage of the Fermi level goes negative until the field reverses direction at a depth of about 0.115u. At this point the field from the N+region farther down causes the voltage to rise up to 3.3 Volts as it reaches a depth of 0.3u, which is the N+ buried layer biased at 3.3 Volts (the I/O voltage). Those familiar with CCD devices will recognize this as a depleted well device where the well reaches a minimum voltage of −1.1 volts. In this case it is desired to avoid filling the well with holes to avoid affecting the Vt of the transistor. Therefore there must be a more heavily doped p-type region near the end of the transistor gate field region which transfers the bias of the p-type substrate to the depleted well.

There are several ways to accomplish this. A p-type region can be formed around the isolation trench. This region should extend into the substrate. This is a normal technique used to prevent inversion problems under the field oxide.

There are other ways to accomplish this result. If a buried layer is used it can be terminated before the trench isolation to allow the trench p doping reach the p-type substrate. Also if a triple well process employing a retrograde n-well is used then the p-well can be extended outside the n-well to reach the p substrate doping. This is also the purpose of the N+ buried layer in the p channel transistor. If a no-buried-layer scheme is used then n doping may be performed in the shallow trench. This doping must be connected to an n+ region at the surface which will be biased at a potential of Vcc plus the depletion voltage. In the present example, 3.3 volts would be fine. This allows the bias of the p-type substrate (e.g., −1.5 volts or more negative; it must be less than the minimum voltage of the depleted p-well) to connect to the depleted well to allow a path to remove holes that will slowly accumulate. Another point to observe is that the minimum voltage in the well must be at least ½ volt less than the surface channel to prevent electrons from going from the surface to the buried layer (commonly called punchthrough). In this example the p well is doped to 2e17 and the n+ buried layer is 1e19.

Figure 3:
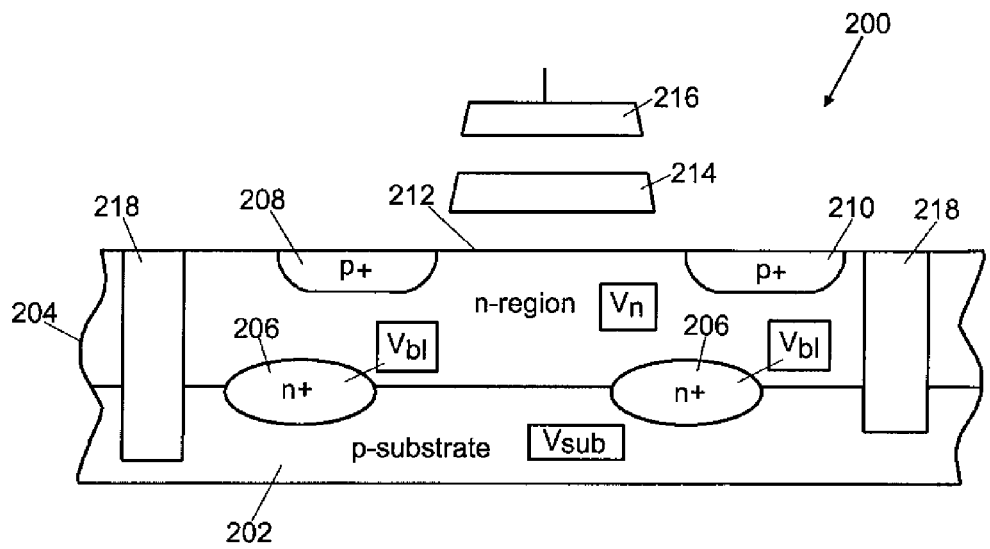
FIG. 3 is a cross-sectional view of an illustrative p-channel embodiment of a reduced-capacitance floating-gate transistor according to the present invention.

FIG. 3 is a simplified cross-sectional view of an illustrative p-channel embodiment of a transistor having fully-depleted junctions according to the present invention. Transistor 200 Transistor is formed on a p-type substrate 202. P-type substrate 202 may be doped to a level of about 1e18. An n-type region 204 is disposed above the substrate 202 and may be formed, for example, as an n-well doped to a level of about 1e17 or as a buried layer. N-type buried layers 206 are disposed at about the boundary between substrate 202 and n-type region 204 and may be doped to a level of from about 1e18 to about 2e18. Those of ordinary skill in the art will appreciate that the doping levels will be process-generation dependent.

P-type source and drain regions 208 and 210 are heavily doped and are disposed in the n-type region 204 and are spaced apart from one another to form a channel region 212. Floating gate 214, preferably formed from doped polysilicon as is known in the art, is disposed above and insulated from the channel 212 and is self aligned with source and drain regions 208 and 210 as is known in the art. Control gate 216, also preferably formed from polysilicon, is disposed above and insulated from floating gate 214. While the embodiment depicted in FIG. 3 is a floating gate memory cell transistor, persons of ordinary skill in the art will readily observe that the principles of the present invention are equally applicable to standard, single-gate p-channel MOS transistors.

An isolation trench 218 surrounds transistor 200 to isolate it from adjacent devices. FIG. 3 only shows the side portions of isolation trench 218; persons of ordinary skill in the art will recognize that portions of isolation trench 218 located in front of and behind the plane of the figure are not shown.

In transistor 200, n-type region 204 is fully depleted by reverse biasing the n-type buried layers with respect to both it and the p-type substrate 202. As an illustrative example, in a 0.15 micron process, the sources and drains will have voltages of between about zero and 1.5 volts, n-type region 204 may be biased at about 3.3 volts which may be supplied by biasing the n-type buried regions 206 at about 3.3 volts, and substrate 202 may be biased at about −3 volts as a result of biasing the integrated for the n-channel devices. The punch through of p-type substrate layer 202 to the source region 208 and drain region 210 is greater than 3.3 volts but is fully depleted by the approximately +3 volts on the n+/n regions 206 and 204. This serves to reduce the junction capacitance of the transistor 200 because the junction between source region 208 and drain region 210 and the fully depleted n-type region 204 has very little junction capacitance. Persons of ordinary skill in the art will recognize that the bias voltages can readily be optimized for device-size scaling and different doping levels.

In addition, because of the punch through of the p-type substrate 202 to the p+ source region 208 and drain region 210 and because n-type region 204 is fully depleted by the +3 volts on the n-type region 204, a field will sweep away any minority carriers to the n-type region 206, thus protecting the surface from being upset by a radiation pulse. Also, the transistor gamma is greatly reduced as change in charge between the n region 206 and the surface is small.

Moreover, by using trench isolation the device field can be run into the substrate buried layer N+ thereby preventing lateral punch through. Thus, the only leakage that may be a concern for radiation hits is VT drift and leakage at the channel-edge to field oxide boundary.

The transistor 200 of FIG. 3 is advantageously employed in a CMOS process where devices such as the transistor 100 of FIG. 1 having a buried layer as n-type region 104 are employed. The same mask may be used to form n-type buried region 104 in transistor 100 of FIG. 1 and n-type buried layers 206 of FIG. 3.

As will be appreciated by persons of ordinary skill in the art, the charge collection from a heavy ion hit is usually collected in the n-channel devices fabricated on the substrate whereas p-channel devices can only collect charge from the shallow n-well in which they are formed. This means that the critical charge collection on the p-channel devices is considerably less. If a designer decides that the p-channel devices do not need shielding then this scheme only needs to be done on the n-channel transistors. Since foundries are presently offering triple-well in a 90 nm process, practice of the present invention is facilitated.

As will be well understood by those of ordinary skill in the art having the benefit of this disclosure, the voltages used in the above example can be varied considerably by changing the dopings and spacings of the various layers of the structure.

It should be understood that various alternatives to the embodiments of the disclosed method and apparatus described herein maybe employed in practicing the disclosed method and using the disclosed apparatus. It is intended that the following claims define the scope of the disclosed method and apparatus and that methods and structures within the scope of these claims and their equivalents be covered thereby.

The invention claimed is:

1. A transistor for an integrated circuit comprising:
   a p-type substrate;
   an n-type region disposed over said p-type substrate;
   n-type buried layers disposed at about a boundary between said substrate and said n-type region, said buried layers doped to a higher level than said n-type region;
   spaced apart p-type source and drain regions disposed in said n-type region forming a channel therein;
   a control gate disposed above and insulated from said channel; and
   said substrate, said n-type region and said n-type buried layers each biased such that said n-type region is fully depleted.

2. The transistor of claim 1 further including an isolation trench disposed in said n-type region and surrounding said source and drain regions, said isolation trench extending down into said substrate.

3. A floating-gate transistor for an integrated circuit comprising:
   a p-type substrate;
   an n-type region disposed over said p-type substrate;
   n-type buried layers disposed at about a boundary between said substrate and said n-type region, said buried layers doped to a higher level than said n-type region;
   spaced apart p-type source and drain regions disposed in said n-type region forming a channel therein;
   a floating gate disposed above and insulated from said channel;
   a control gate disposed above and insulated from said floating gate; and
   said substrate, said n-type region and said n-type buried layers each biased such that said n-type region is fully depleted.

4. The floating-gate transistor of claim 3 further including an isolation trench disposed in said n-type region and surrounding said source and drain regions, said isolation trench extending down into said substrate.

5. A transistor for an integrated circuit comprising:
   an n-type substrate;
   a p-type region disposed over said n-type substrate;
   p-type buried layers disposed at about a boundary between said substrate and said p-type region, said buried layers doped to a higher level than said p-type region;
   spaced apart n-type source and drain regions disposed in said p-type region forming a channel therein;
   a control gate disposed above and insulated from said channel; and
   said substrate, said p-type region and said p-type buried layers each biased such that said p-type region is fully depleted.

6. The transistor of claim 5 further including an isolation trench disposed in said p-type region and surrounding said source and drain regions, said isolation trench extending down into said substrate.

7. A floating-gate transistor for an integrated circuit comprising:
   an n-type substrate;
   a p-type region disposed over said n-type substrate;
   p-type buried layers disposed at about a boundary between said substrate and said p-type region, said buried layers doped to a higher level than said p-type region;
   spaced apart n-type source and drain regions disposed in said p-type region forming a channel therein;
   a floating gate disposed above and insulated from said channel;
   a control gate disposed above and insulated from said floating gate; and
   said substrate, said p-type region and said p-type buried layers each biased such that said p-type region is fully depleted.

8. The floating-gate transistor of claim 7 further including an isolation trench disposed in said p-type region and surrounding said source and drain regions, said isolation trench extending down into said substrate.

* * * * *